US006872998B2

United States Patent
Hirano et al.

(10) Patent No.: US 6,872,998 B2
(45) Date of Patent: Mar. 29, 2005

(54) FERROELECTRIC MEMORY DEVICE

(75) Inventors: Hiroshige Hirano, Nara (JP); Toshiyuki Honda, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/333,049

(22) Filed: Jun. 15, 1999

(65) Prior Publication Data

US 2002/0008263 A1 Jan. 24, 2002

(30) Foreign Application Priority Data

Jun. 16, 1998 (JP) ............................................ 10-167857

(51) Int. Cl.⁷ ...................... H01L 27/108; H01L 29/76; H01L 29/94; H01L 31/119
(52) U.S. Cl. ...................... 257/296; 257/303; 257/306
(58) Field of Search ............................ 438/3, 239, 240, 438/241, 253, 396, 631, 758; 257/295, 296, 300, 303, 306, 311, 532, 535, FOR 295, FOR 300, FOR 311, FOR 535, 758

(56) References Cited

U.S. PATENT DOCUMENTS

| | | | | |
|---|---|---|---|---|
| 5,438,023 A | * | 8/1995 | Argos, Jr. et al. ............... | 438/3 |
| 5,593,914 A | * | 1/1997 | Evans, Jr. et al. ............... | 438/3 |
| 5,767,541 A | * | 6/1998 | Hanagasaki .................. | 257/295 |
| 5,869,859 A | * | 2/1999 | Hanagasaki .................. | 257/296 |
| 6,174,766 B1 | * | 1/2001 | Hayashi et al. ............. | 438/241 |

FOREIGN PATENT DOCUMENTS

| | | |
|---|---|---|
| JP | 08-172168 | 7/1996 |
| JP | 09-289297 | 11/1997 |
| JP | 11-121705 | 4/1999 |

OTHER PUBLICATIONS

Notice of Reasons for Rejection for Japanese Patent Application No. 10–167857 dated Mar. 6, 2001 with English translation.

\* cited by examiner

*Primary Examiner*—Hoai Pham
(74) *Attorney, Agent, or Firm*—Nixon Peabody LLP; Donald R. Studebaker

(57) ABSTRACT

A memory cell transistor using a word line WL as the gate thereof is provided in an active region OD, and a ferroelectric capacitor, including bottom electrode, ferroelectric film and top electrode TE, is formed on a field oxide film. A first interconnection layer is made up of storage lines, each connecting the top electrode TE to one of doped layers of the memory cell transistor, and bit lines, each of which is connected to the other doped layer. In a planar layout, the storage line-intersects only one side of the top electrode TE and the bit line BL does not overlap with the top electrode TE. Thus, it is possible to prevent the retention characteristics of the ferroelectric capacitor from being deteriorated due to the stress applied by the first interconnection layer to the ferroelectric capacitor. As a result, the reliability of a ferroelectric memory device, including, in a memory cell, a ferroelectric capacitor with a ferroelectric film interposed between the bottom and top electrodes, can be improved.

20 Claims, 5 Drawing Sheets

US 6,872,998 B2

FERROELECTRIC MEMORY DEVICE

BACKGROUND OF THE INVENTION

The present invention relates to a ferroelectric memory device, and more particularly relates to measures taken to improve the reliability thereof.

Over the past few years, portable communications terminals, IC cards and the like have been rapidly popularized around the world. To operate these types of electronic units more efficiently, nonvolatile semiconductor memory devices for use in these units are increasingly required to operate at an even lower voltage and at an even higher speed while consuming even lower power. A ferroelectric memory device is one of strong candidate nonvolatile memory devices that are expected to fulfill these requirements at the same time. A device of this type includes a ferroelectric capacitor, in which a ferroelectric film is sandwiched between a pair of electrodes. Data can be stored thereon in a nonvolatile manner depending on whether the ferroelectric material within the capacitor is polarized in one direction or the other, which is reversed by the application of a positive or negative electric field. In rewriting data stored on a ferroelectric memory device, such an electric field as reversing the direction of polarization in the ferroelectric film has only to be applied. Accordingly, the ferroelectric memory device can advantageously contribute to higher-speed operation with lower voltage applied and lower power dissipated.

FIG. 4 is a plan view of an array of memory cells in a conventional ferroelectric memory device as viewed from above its layer in which bit lines are formed. FIG. 5 is a vertical cross-sectional view of part of the array taken along the line V—V in FIG. 4.

As shown in FIG. 5, an active region OD is formed to be surrounded by a LOCOS film 52 on an Si substrate 51. Within this active region OD, source/drain doped layers 53, and polysilicon gates 54 are formed. A first interlevel dielectric film 55 is formed over the Si substrate 51. Memory cell capacitors are formed at respective regions over the LOCOS film 52 on the first interlevel dielectric film 55. Each of these memory cell capacitors includes: a bottom electrode 56 made of a metal such as platinum or iridium; a ferroelectric film 57 made of a ferroelectric material; and a top electrode 58 also made of a metal such as platinum or iridium. A second interlevel dielectric film 59 is formed over the first interlevel dielectric film 55. And storage lines 60, made of aluminum containing copper, are formed on the second interlevel dielectric film 59.

In FIG. 4, the gates 54 and bottom electrodes 56 extend along the rows of the array as word lines WL0, WL1, WL2 and WL3 and cell plate lines CP0, CP1, CP2 and CP3, respectively. A group of bit lines BL0, /BL0, BL1, /BL1, DBL and /DBL are formed to extend along the columns of the array. One of these bit lines, i.e., a bit line DBL, is illustrated in FIG. 5 by a phantom line. Each top electrode 58 shown in FIG. 5 corresponds to a data storage node of a DRAM, and is identified by TE in FIG. 4. Each storage line 60 is connected to an associated top electrode 58 via a contact CE and to an associated doped layer 53 of the memory cell transistor via a contact CW1. Each bit line BL0, /BL0, BL1, /BL1, DBL or /DBL is connected to an associated doped layer 53 via a contact CW2. And the respective storage lines 60 and the group of bit lines BL0, /BL0, BL1, /BL1, DBL and /DBL constitute a first interconnection layer.

In this device, data can be retained as either "0" or "1" by holding a ferroelectric film 57 in either positively or negatively polarized state depending on a level difference between a voltage on a bit line supplied via an associated doped layer 53 and a voltage on an associated cell plate line.

The reliability of this ferroelectric memory device sometimes deteriorates due to the infant mortality failure of the ferroelectric capacitor or degradation in retention characteristics thereof. The present inventors carried out intensive research to find out measures to be taken for solving this problem. As a result of experiments, we obtained data suggesting that the decrease in reliability might have been brought about probably because a storage line 60 exists over an excessively wide range above an associated top electrode 58 of a ferroelectric capacitor.

SUMMARY OF THE INVENTION

An object of the present invention is providing a ferroelectric memory device with improved reliability, in which the deterioration in characteristics of a ferroelectric capacitor can be eliminated by controlling an overlap area between a storage line and an underlying top electrode in a planar layout.

To achieve this object, the present invention adopts a structure in which a first interconnection layer does not cover at least one side of each top electrode of a memory cell in the planar layout thereof.

A ferroelectric memory device according to the present invention includes a ferroelectric capacitor including a top electrode having a rectangular planar pattern, a bottom electrode, and a ferroelectric film interposed between the top and bottom electrodes. The memory device further includes a memory cell transistor including first and second doped layers and a gate. The memory cell transistor is used for controlling a voltage supplied to the top electrode of the ferroelectric capacitor. The memory device further includes: an interlevel dielectric film formed over the memory cell transistor and the ferroelectric capacitor; and a first interconnection layer formed on the interlevel dielectric film. In the planar layout of the memory device, the first interconnection layer partially overlaps with the top electrode of the ferroelectric capacitor, and does not cover at least one side of the rectangular top electrode.

In this structure, a stress applied by the first interconnection layer to the ferroelectric capacitor or a leakage current flowing between adjacent portions of the first interconnection layer decreases, thus preventing decrease in early yield resulting from leakage failure and deterioration in retention characteristics. As a result, the reliability of the ferroelectric memory device can be improved.

In one embodiment of the present invention, the first interconnection layer includes a storage line and a bit line. The storage line is connected to the top electrode of the ferroelectric capacitor and to the first doped layer of the memory cell transistor, and is linear in the planar pattern thereof. The bit line is connected to the second doped layer of the memory cell transistor. In this particular embodiment, the storage line may intersect only one side of the top electrode of the ferroelectric capacitor in the planar layout. Alternatively or additionally, the bit line may not overlap with the top electrode of the ferroelectric capacitor in the planar layout.

In another embodiment of the present invention, the storage line may include: a first region connected to the top electrode of the ferroelectric capacitor; a second region connected to the first doped layer of the memory cell transistor; and a third region interposed between the first and second regions. The third region may intersect the side of the top electrode in the planar layout. The line width of the third region is preferably smaller than that of the first and second regions.

In such an embodiment, remarkable effects can be attained in respect of the stress reduction and so on.

In still another embodiment, the first interconnection layer is preferably made of a material containing at least one of aluminum and copper.

In still another embodiment, the ferroelectric memory device may further include: an upper interlevel dielectric film formed to cover the first interconnection layer; and a second interconnection layer formed on the upper interlevel dielectric film. The second interconnection layer may totally cover the top electrode of the ferroelectric capacitor in the planar layout.

In still another embodiment, the ferroelectric memory device may further include: an upper interlevel dielectric film formed to cover the first interconnection layer; and a second interconnection layer formed on the upper interlevel dielectric film. The second interconnection layer may totally cover the bottom electrode of the ferroelectric capacitor in the planar layout.

In these embodiments, it is possible to prevent the characteristics of the ferroelectric capacitor from being deteriorated due to annealing conducted before the second interconnection layer is formed. In addition, the stress applied to the ferroelectric capacitor during the formation of the second interconnection layer can be relaxed.

In still another embodiment, the second interconnection layer is also preferably made of a material containing at least one of aluminum and copper.

DESCRIPTION OF THE PREFERRED EMBODIMENTS

Embodiment 1

Figure 1:
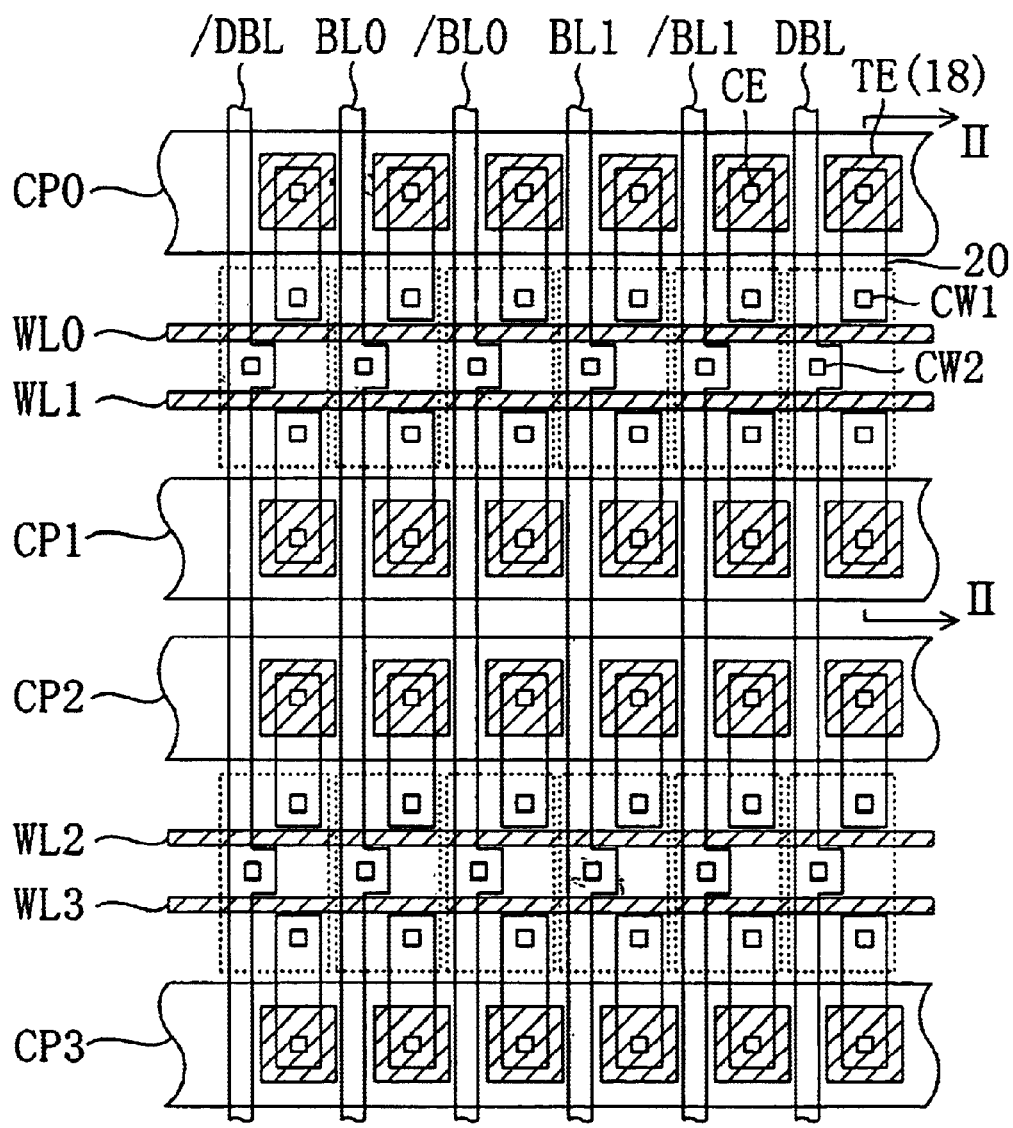
FIG. 1 is a plan view of a ferroelectric memory device according to a first embodiment of the present invention as viewed from above a first interconnection layer thereof.
Figure 2:
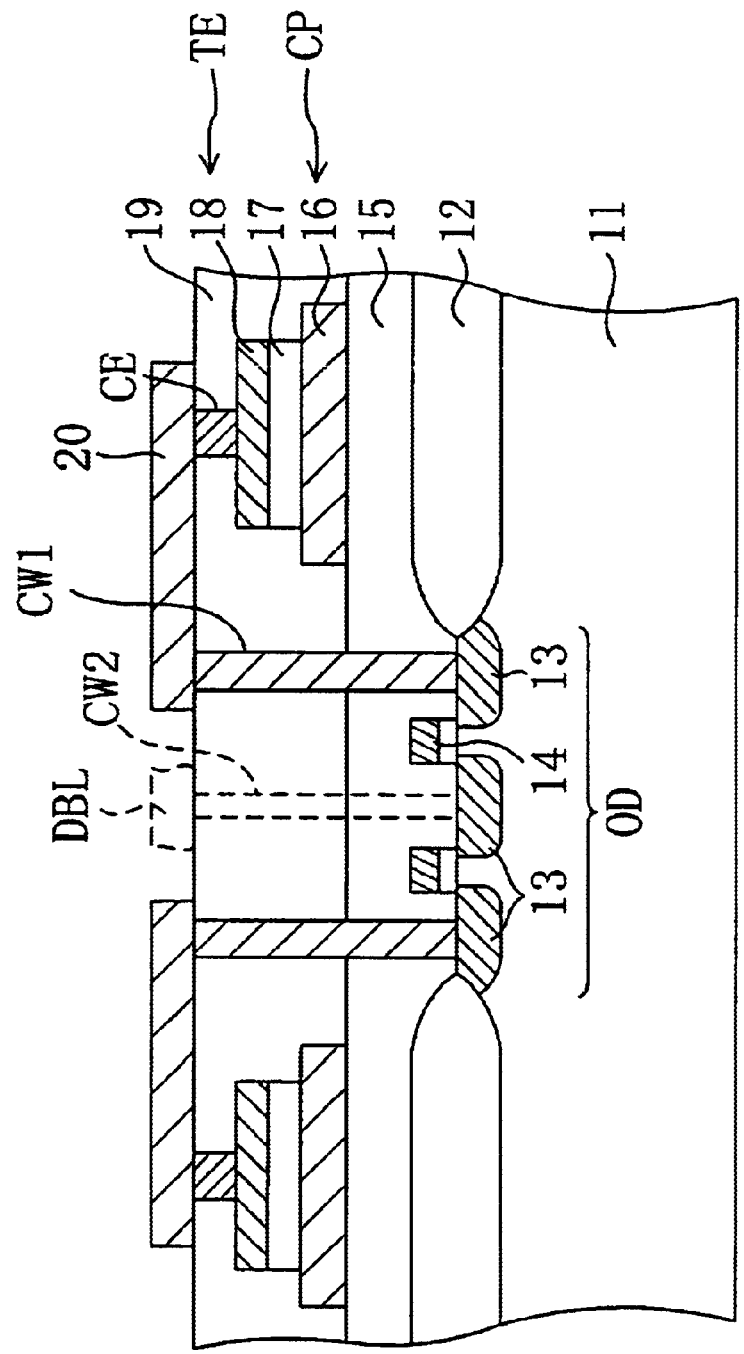
FIG. 2 is a cross-sectional view of the device taken along the line II—II in FIG. 1.

FIG. 1 is a plan view of an array of memory cells in a ferroelectric memory device according to a first embodiment of the present invention as viewed from above a layer in which bit lines are formed. FIG. 2 is a vertical cross-sectional view of the device taken along the line II—II in FIG. 1.

As shown in FIG. 2, an active region OD is formed to be surrounded by a LOCOS film 12 on an Si substrate 11. Within this active region OD, source/drain doped layers 13 and polysilicon gates 14 are provided. A first interlevel dielectric film 15 is formed over the Si substrate 11. Memory cell capacitors are formed at respective regions over the LOCOS film 12 on the first interlevel dielectric film 15. Each of these memory cell capacitors includes: a bottom electrode 16 made of a metal such as platinum or iridium; a ferroelectric film 17 made of a ferroelectric material described later; and a top electrode 18 also made of a metal such as platinum or iridium. A second interlevel dielectric film 19 is formed over the first interlevel dielectric film 15. And storage lines 20 made of aluminum containing copper are formed on the second interlevel dielectric film 19.

In FIG. 1, the gates 14 and bottom electrodes 16 extend as word line WL0, WL1, WL2 and WL3 and cell plate lines CP0, CP1, CP2 and CP3, respectively, along the rows of the array. A group of bit lines BL0, /BL0, BL1, /BL1, DBL and /DBL are formed to extend along the columns of the array. One of these bit lines, i.e., a bit line DBL, is illustrated in FIG. 2 by a phantom line. Each top electrode 18 shown in FIG. 2 corresponds to a data storage node of a DRAM, and is identified by TE in FIG. 1. Each storage line 20 is connected to an associated top electrode 18 via a contact CE and to an associated doped layer 13 of the memory cell transistor via a contact CW1. Each bit line BL0, /BL0, BL1, /BL1, DBL or /DBL is connected to an associated doped layer 13 via a contact CW2. And the respective storage lines 20 and the group of bit lines BL0, /BL0, BL1, /BL1, DBL and /DBL constitute a first interconnection layer.

In this device, data can be retained as either "0" or "1" by holding a ferroelectric film 17 in either positively or negatively polarized state depending on a level difference between a voltage on a bit line supplied via an associated doped layer 13 and a voltage on an associated cell plate line.

Figure 4:
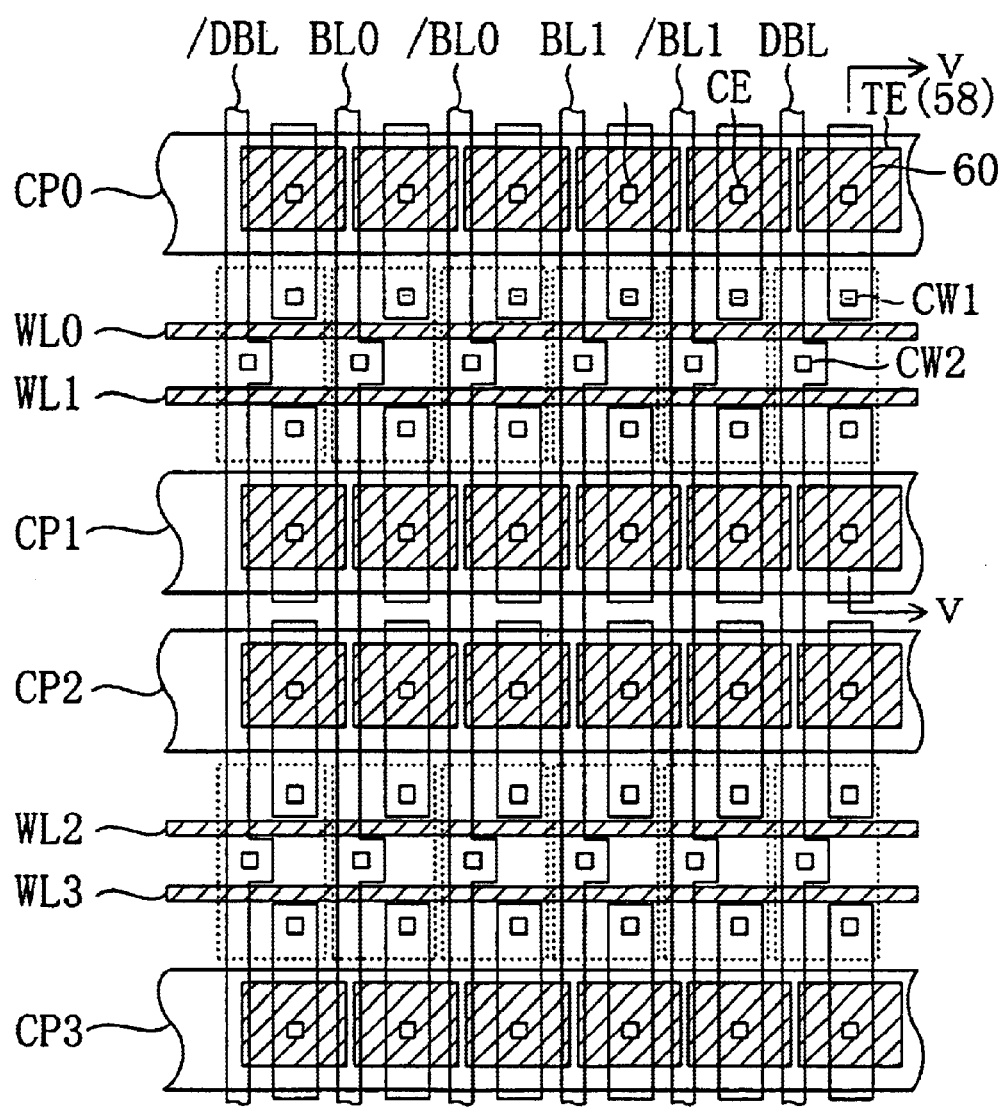
FIG. 4 is a plan view of a conventional ferroelectric memory device as viewed from above a first interconnection layer thereof.
Figure 5:
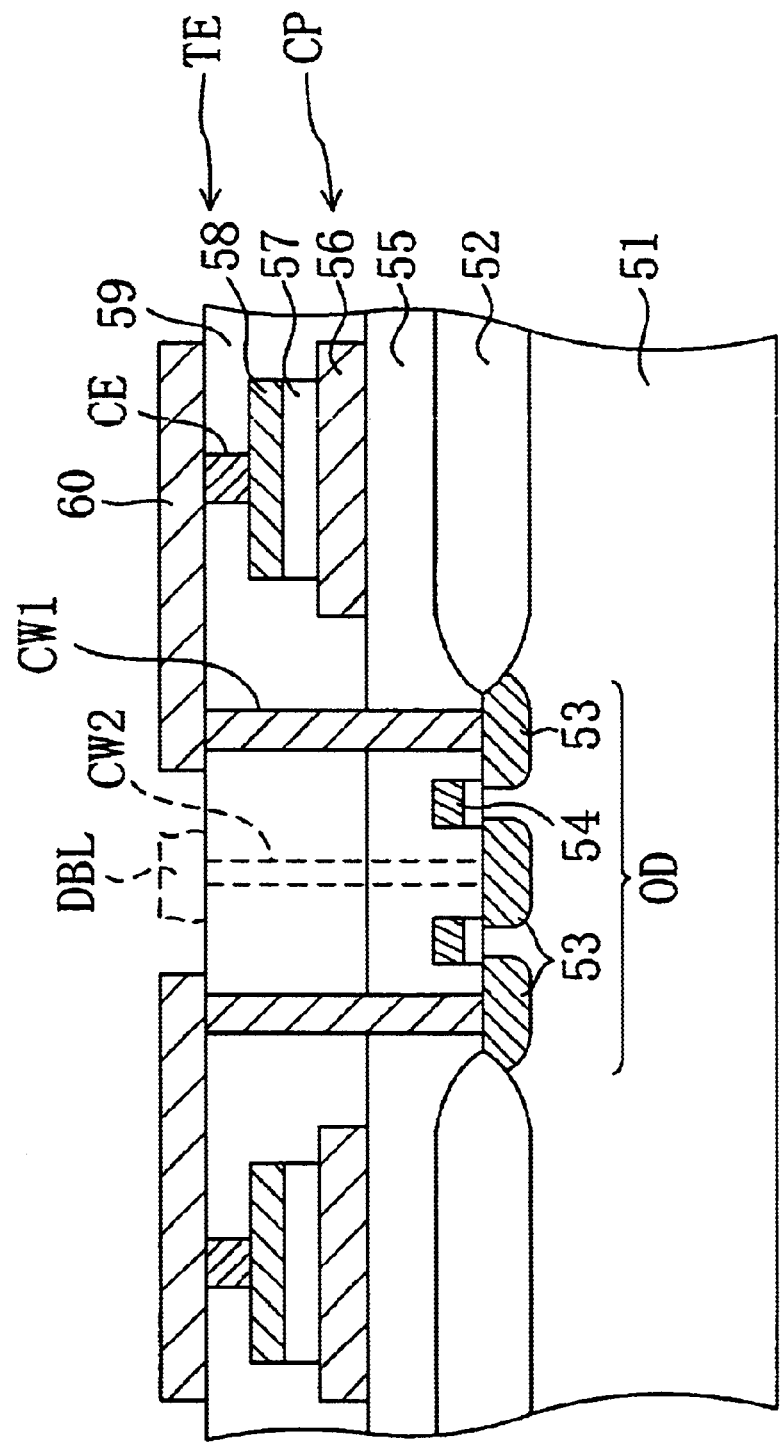
FIG. 5 is a cross-sectional view of the device taken along the line V—V in FIG. 4.

The ferroelectric memory device of the present invention is characterized in that a storage line 20 overlaps with an associated top electrode (TE) 18 in a different planar area than that of the conventional structure. In the conventional ferroelectric memory device structure, the right end of each storage line 60 goes over an associated side of an underlying top electrode 58 to protrude outward as shown in FIG. 5. In the plan view shown in FIG. 4, each storage line 60 intersects two sides of an associated top electrode 58. In contrast, in the ferroelectric memory device of the present invention, the right end of each storage line 20 does not protrude outward from an associated side of an underlying top electrode 18 as shown in FIG. 2. In the plan view shown in FIG. 1, each storage line 20 intersects only one side of an associated top electrode 18. Furthermore, in the conventional structure shown in FIG. 4, each bit line covers another two sides of an associated pair of top electrodes 58. On the other hand, according to the present invention, each bit line (e.g., BL1) is disposed not to overlap with any top electrode 20 in the planar layout of the device. In other words, as viewed from above, the first interconnection layer covers all of the four sides of each top electrode 60 in the conventional ferroelectric memory device shown in FIG. 4. In contrast, the first interconnection layer does not cover at least one side of each top electrode 18 in the inventive ferroelectric memory device shown in FIG. 1.

In a contact CE between a top electrode 18 and an associated storage line 20, an overlap margin is defined at a minimum size according to a design rule in view of a mask-to-mask placement error between the contact CE and the storage line 20.

By reducing in this way the overlap area between a storage line 20 and an associated top electrode 18 as much as possible, the following effects are attained. Specifically, it is possible to prevent the early yield from decreasing due to a leakage failure between a bit line and a storage line. In addition, the characteristics of the ferroelectric capacitor can be significantly improved in respect of data retention, in particular. This is because the polarizability of the ferroelectric capacitor can be improved. At present, these effects are attained probably because of the following reasons: decrease in stress applied by a storage line 20 to an associated ferroelectric capacitor; and/or reduction in leakage caused between a storage line 20 shorter in length and a neighboring bit line (e.g., BL1). Also, possibly, advantageous effects of a material for a third interlevel dielectric film (not shown), which is formed over the storage lines 20, on the ferroelectric capacitors might be promoted with such a configuration.

It should be noted, however, so long as each storage line 20 covers only one side of an associated top electrode 18 (TE) in the planar layout, an associated bit line may overlap with the top electrode 18. Alternatively, in the planar layout, if each bit line (e.g., BL1) does not overlap with an associated top electrode 18, then an associated storage line 20 may cover two sides of the top electrode 18. Nevertheless, according to the illustrated embodiment, the stress applied by the first interconnection layer to the top electrode 18 can be reduced more significantly than any other possible alternative exemplified above, resulting in marvelous improvement of the retention characteristics.

Also, in this embodiment, dummy bit lines DBL and /DBL are disposed at the far ends of the array of memory cells so as not to use the ferroelectric capacitors at those ends during the operation of the device. This is because even with the structure of this embodiment, the characteristics might not be improved otherwise. Specifically, although a memory cell located at an end of the array has the same structure as any other memory cell within the array, the former cell is adjacent to a region where no cells exist, and therefore exhibits a different characteristic than that of the latter cell.

If the ferroelectric memory device is fabricated to further include: a third interlevel dielectric film formed over the storage lines 20; and a second interconnection layer formed thereon (not shown), then that second interconnection layer may cover the top or bottom electrodes 18 or 16. In such a case, it is possible to prevent the characteristics of a ferroelectric capacitor from being deteriorated due to annealing conducted before the second interconnection layer is formed. In addition, the stress applied to the ferroelectric capacitor during the formation of the second interconnection layer can be relaxed.

Particularly when the second interconnection layer is made of a material containing aluminum and/or copper, the following effects are attained. The second interconnection layer may be used as a backing layer for reducing the resistance of a word line (e.g., WL0, WL1) made of polysilicon and/or a cell plate line (e.g., CP0, CP1), which is the bottom electrode 16 of the ferroelectric capacitor. Since the resistance can be reduced, the ferroelectric memory device can operate at a higher speed. In addition, even if a word line is disconnected during a manufacturing process, electrical failures are less likely to happen, because the second interconnection layer, serving as a backing layer, are connected at numerous points.

Embodiment 2

Figure 3:
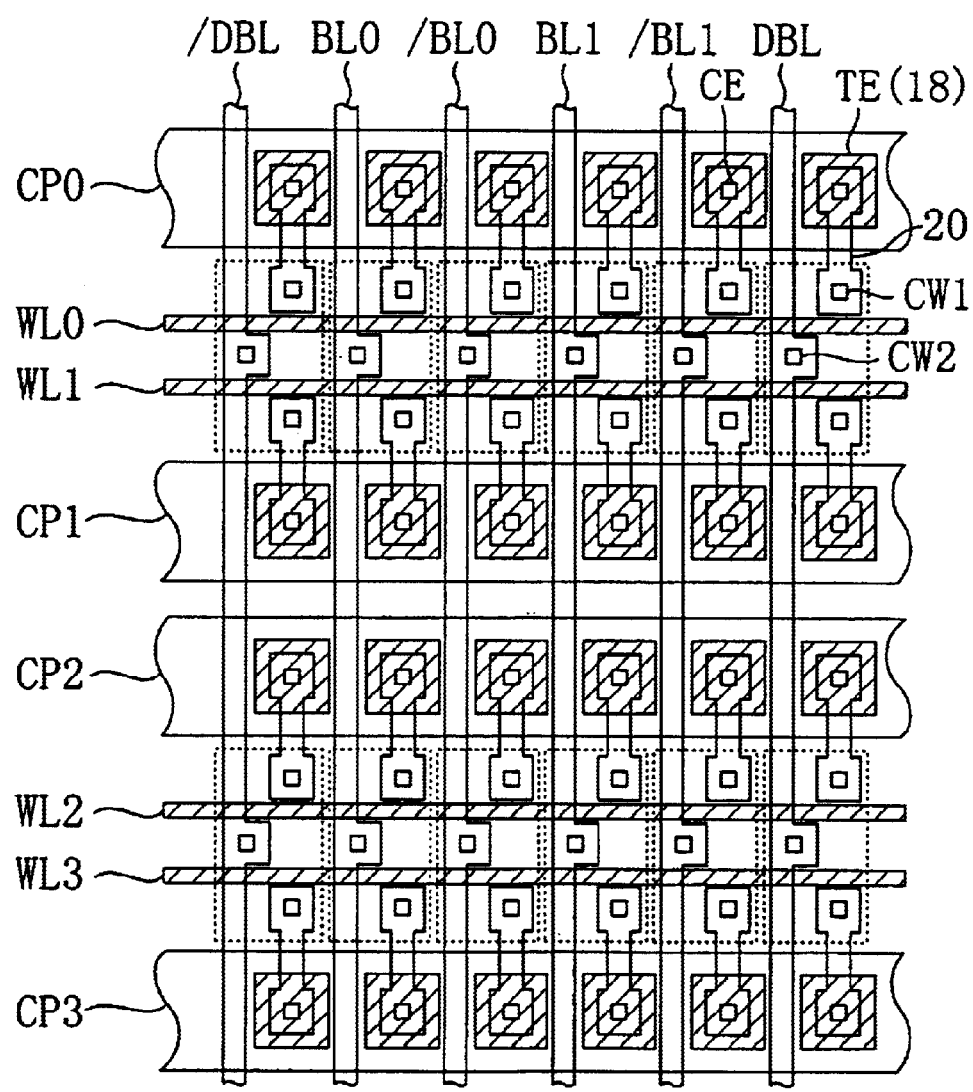
FIG. 3 is a plan view of a ferroelectric memory device according to a second embodiment of the present invention as viewed from above a first interconnection layer thereof.

FIG. 3 is a plan view of an array of memory cells according to a second embodiment of the present invention as viewed from above its layer in which bit lines are formed.

The ferroelectric memory device of the second embodiment is characterized in that the overlap area between each storage line 20 and an associated top electrode 18 (TE) is even smaller than that in the first embodiment. Specifically, as shown in FIG. 3, each storage line 20 has such a planar shape that the line width of the central region thereof is smaller than that of the other regions thereof. The line width of the central region is defined at the minimum value according to a design rule for forming the storage line. In the other respects, the structure of the second embodiment is the same as that of the first embodiment.

In the ferroelectric memory device of the second embodiment, the overlap area between each storage line 20 and an associated top electrode 18 is further reduced as compared to the ferroelectric memory device of the first embodiment. Accordingly, the effects of the first embodiment can be attained more remarkably.

In the second embodiment, a second interconnection layer may also be formed over the storage lines 20 with a third interlevel dielectric film interposed therebetween as described in the first embodiment.

It should be noted, however, so long as each storage line 20 covers only one side of an associated top electrode 18 (TE) in the planar layout, an associated bit line may overlap with the top electrode 18. Alternatively, in the planar layout, if each bit line (e.g., BL1) does not overlap with an associated top electrode 18, then an associated storage line 20 may cover two sides of the top electrode 18. Nevertheless, according to the illustrated embodiment, the stress applied by the first interconnection layer to the top electrode 18 can be reduced more significantly than any other possible alternative exemplified above, resulting in marvelous improvement of the retention characteristics.

In the foregoing embodiments, the ferroelectric film 17 may be made of a ferroelectric material selected from the group consisting of $KNO_3$, $PbLa_2O_3$—$ZrO_2$—$TiO_2$ and $PbTiO_3$—$PbZrO_3$.

What is claimed is:

1. A ferroelectric memory device comprising;
   a plurality of ferroelectric capacitors, each including a top electrode, a common bottom electrode and a ferroelectric film interposed therebetween;
   a plurality of memory cell transistors, each including first and second doped layers and a gate, each of said plurality of memory cell transistors controlling a voltage supplied to the top electrode of a corresponding ferroelectric capacitor;
   a first interlevel dielectric film formed over the plurality of memory cell transistors and the plurality of ferroelectric capacitors; and
   a plurality of interconnection layers formed on the first interlevel dielectric film, each of the plurality of interconnection layers electrically connecting a memory cell transistor to a corresponding ferroelectric capacitor;
   wherein, in a plan view of the ferroelectric memory device, all interconnection layers formed on the first interlevel dielectric film and electrically connecting a respective memory cell transistor to a corresponding ferroelectric capacitor, each of the interconnection layers extending over only one side of the common bottom electrode and only one side of a corresponding ton electrode, and the width of a bit line formed above a respective top electrode is smaller than the distance between the respective top electrode and an adjacent top electrode.

2. The device of claim 1, wherein each of the plurality of interconnection layers includes:
   a storage line connected to the top electrode of the corresponding ferroelectric capacitor and to the first doped layer of the corresponding memory cell transistor, the storage line having a linear planar pattern; and
   a bit line connected to the second doped layer of the corresponding memory cell transistor, and wherein the storage line intersects only one side of the top electrode in the planar layout.

3. The device of claim 2, wherein the storage line includes:
- a first region connected to the top electrode of the corresponding ferroelectric capacitor;
- a second region connected to the first doped layer of the corresponding memory cell transistor; and
- a third region being interposed between the first and second regions and intersecting the side of the top electrode in the planar layout, and wherein the line width of the third region is smaller than that of the first and second regions.

4. The device of claim 2, wherein the bit line does not overlap with the top electrode in the planar layout.

5. The device of claim 4, wherein the storage line includes:
- a first region connected to the top electrode of the corresponding ferroelectric capacitor;
- a second region connected to the first doped layer of the corresponding memory cell transistor; and
- a third region being interposed between the first and second regions and intersecting the side of the top electrode in the planar layout, and wherein the line width of the third region is smaller than that of the first and second regions.

6. The device of claim 1, wherein each of the plurality of interconnection layers includes:
- a storage line connected to the top electrode of the corresponding ferroelectric capacitor and to the first doped layer of the corresponding memory cell transistor, the storage line having a linear planar pattern; and
- a bit line connected to the second doped layer of the corresponding memory cell transistor, and wherein the bit line does not overlap with the top electrode in the planar layout.

7. The device of claim 1, wherein each of the plurality of interconnection layers is made of a material containing at least one of aluminum and copper.

8. The device of claim 1, further comprising:
- an upper interlevel dielectric film formed to cover each of the plurality of interconnection layers; and
- an upper interconnection layer formed on the upper interlevel dielectric film, wherein the upper interconnection layer totally covers the top electrode of the corresponding ferroelectric capacitor in the plan view.

9. The device of claim 8, wherein the upper interconnection layer is made of a material containing at least one of aluminum and copper.

10. The device of claim 1, further comprising:
- an upper interlevel dielectric film formed to cover each of the plurality of interconnection layers; and
- an upper interconnection layer formed on the upper interlevel dielectric film, wherein the upper interconnection layer totally covers the bottom electrode of the corresponding ferroelectric capacitor in the plan view.

11. The device of claim 10, wherein the upper interconnection layer is made of a material containing at least one of aluminum and copper.

12. The device of claim 1, wherein the ferroelectric memory device comprises a plurality of memory cells arranged in a matrix, each of the plurality of memory cells comprises a respective ferroelectric capacitor and a corresponding memory cell transistor.

13. The device of claim 1, wherein each of the plurality of interconnection layers extends in a direction orthogonal to the longitudinal direction of the common bottom electrode.

14. The device of claim 1, wherein each of the plurality of interconnection layers is electrically connected to a corresponding memory cell transistor by a first contact and to a corresponding ferroelectric capacitor by a second contact.

15. The device of claim 1, wherein each of the plurality of top electrodes has a rectangular planar pattern.

16. The device of claim 1, wherein the plurality of ferroelectric capacitors, the plurality of memory cell transistors, the first interlevel dielectric film and the plurality of interconnection layers form a row of an array of the ferroelectric memory device, and the array of the ferroelectric memory device comprises a plurality of the rows.

17. A ferroelectric memory device comprising;
- a ferroelectric capacitor including a top electrode, a bottom electrode and a ferroelectric film interposed between the top and bottom electrodes, the top electrode having a rectangular planar pattern;
- a memory cell transistor including first and second doped layers and a gate, the memory cell transistor controlling a voltage supplied to the top electrode of the ferroelectric capacitor;
- a first interlevel dielectric film formed over the memory cell transistor and the ferroelectric capacitor;
- a first interconnection layer formed on the first interlevel dielectric film; and
- a memory cell composed of the ferroelectric capacitor and the memory cell transistor, wherein, in a planar layout of the ferroelectric memory device, the first interconnection layer partially overlaps with the top electrode of the ferroelectric capacitor, and does not cover at least one side of the rectangular top electrode, and the width of a bit line formed above the top electrode is smaller than the distance between the top electrode and another top electrode adjacent to the top electrode;

wherein the memory cell comprises a memory cell array arranged in a matrix, wherein the first interconnection layer extends only in one direction with respect to the top and bottom electrodes, and wherein a plurality of the top electrodes is arranged only in a row with respect to the direction of the length of the bottom electrode, wherein the first interconnection layer includes:
- a storage line connected to the top electrode of the ferroelectric capacitor and to the first doped layer of the memory cell transistor, the storage line having a linear planar pattern; and
- the bit line connected to the second doped layer of the memory cell transistor, and wherein the storage line intersects only one side of the top electrode in the planar layout, and wherein the storage line includes:
- a first region connected to the top electrode of the ferroelectric capacitor;
- a second region connected to the first doped layer of the memory cell transistor; and a third region being interposed between the first and second regions and intersecting the side of the top electrode in the planar layout, and wherein the line width of the third region is smaller than that of the first and second regions.

18. The device of claim 17, wherein the bit line does not overlap with the top electrode in the planar layout.

19. A ferroelectric memory device comprising, a plurality of ferroelectric capacitors, each including a top electrode, a common bottom electrode and a ferroelectric film interposed therebetween;

a first interlevel dielectric film formed over the plurality of ferroelectric capacitors; and a plurality of interconnection layers formed on the first interlevel dielectric film, wherein, in a plan review of the ferroelectric memory device, all interconnection layers formed on the first interlevel dielectric film, each of the interconnection layers extending over only one side of the common bottom electrode and only one side of a corresponding top electrode, and the width of a bit line formed above a respective top electrode is smaller than the distance between the respective top electrode and an adjacent top electrode.

20. The device of claim 19, wherein each of the plurality of interconnection layers is made of a material containing at least one of aluminum and copper.

* * * * *

UNITED STATES PATENT AND TRADEMARK OFFICE
CERTIFICATE OF CORRECTION

PATENT NO.   : 6,872,998 B2  
DATED        : March 29, 2005  
INVENTOR(S)  : Hiroshige Hirano et al.

Page 1 of 1

It is certified that error appears in the above-identified patent and that said Letters Patent is hereby corrected as shown below:

Column 6,
Line 54, "ton" should read -- top --.

Signed and Sealed this

Twentieth Day of September, 2005

JON W. DUDAS  
*Director of the United States Patent and Trademark Office*